United States Patent [19]
Kurisu et al.

[11] Patent Number: 5,634,205
[45] Date of Patent: May 27, 1997

[54] RADIO EQUIPMENT BASED ON AFC SYSTEM WITH TEMPERATURE DETECTION AND METHOD OF AUTOMATIC FREQUENCY CONTROL

[75] Inventors: Yoshikazu Kurisu, Ichihara; Yojiro Tagawa, Narashino; Ping Huang, Chiba, all of Japan

[73] Assignee: Uniden Corporation, Chiba, Japan

[21] Appl. No.: 305,966

[22] Filed: Sep. 15, 1994

[30] Foreign Application Priority Data

Apr. 19, 1994 [JP] Japan ................................. 6-100187

[51] Int. Cl.⁶ ......................................................... H04B 1/16
[52] U.S. Cl. ........................................ 455/182.2; 455/192.2; 455/259
[58] Field of Search ........................... 455/182.1, 182.2, 455/192.1, 192.2, 192.3, 186.1, 258, 259; 375/344; 331/175, 176, 177 R

[56] References Cited

U.S. PATENT DOCUMENTS

| | | | |
|---|---|---|---|
| 4,691,377 | 9/1987 | Yoshihara et al. | 455/259 |
| 4,709,406 | 11/1987 | Omoto | 455/182.2 |
| 4,893,097 | 1/1990 | Zwack | 331/176 |
| 4,921,467 | 5/1990 | Lax | 331/176 |
| 5,404,587 | 4/1995 | Okanobu | 455/182.2 |

FOREIGN PATENT DOCUMENTS

| | | |
|---|---|---|
| 57-35430 | 2/1982 | Japan . |
| 61-251240 | 11/1986 | Japan . |
| 1-49312 | 2/1989 | Japan . |
| 2-20113 | 1/1990 | Japan . |
| 2-180435 | 7/1990 | Japan . |
| 2-141148 | 11/1990 | Japan . |
| 3-173226 | 7/1991 | Japan . |
| 4-150609 | 5/1992 | Japan . |
| 4-156728 | 5/1992 | Japan . |
| 4-234213 | 8/1992 | Japan . |
| 4-293318 | 10/1992 | Japan . |
| 4-337928 | 11/1992 | Japan . |
| 5-145445 | 6/1993 | Japan . |
| 5-206908 | 8/1993 | Japan . |

*Primary Examiner*—Edward F. Urban
*Attorney, Agent, or Firm*—Lowe, Price, LeBlanc & Becker

[57] ABSTRACT

Radio equipment based on an AFC system comprising a local oscillator, a reference frequency oscillator, a receiver, a frequency comparator, an AFC controller, a temperature detection sensor, and a memory. The AFC controller inputting, when starting AFC, reads out a control frequency corresponding to the detected temperature inputted thereto to control the reference frequency for the reference frequency oscillator. When a lock signal is inputted thereinto, the detected temperature and control frequency are stored in a memory.

17 Claims, 10 Drawing Sheets

CONTENTS OF MEMORY

| DETECTED TEMPERATURE | NUMBER OF STEPS FOR A F C |
|---|---|
| $t_{35}$ | step15 |
| $t_{-10}$ | step10 |
| $t_{10}$ | step30 |
| $t_{20}$ | step16 |

F I G. 6
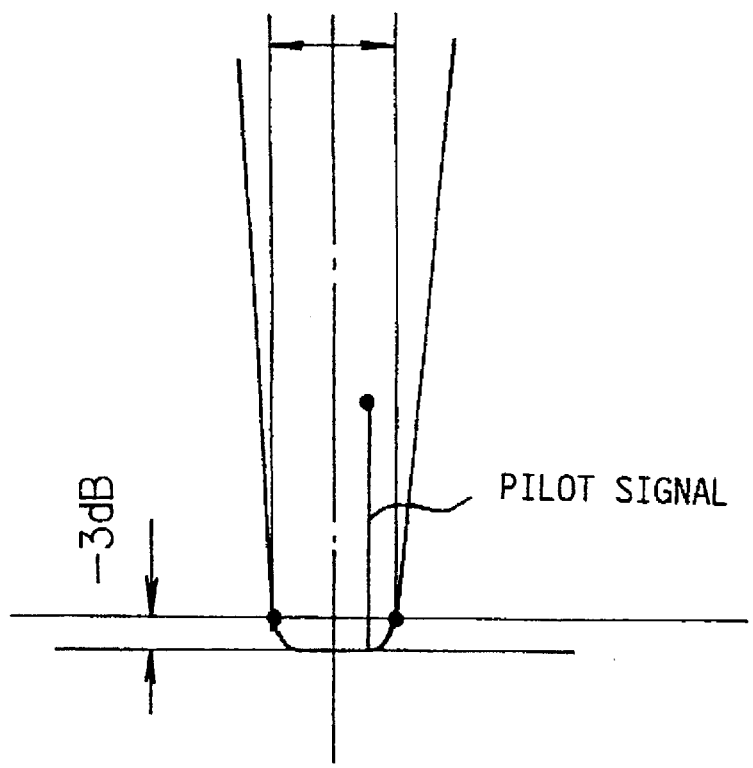

FIG. 9
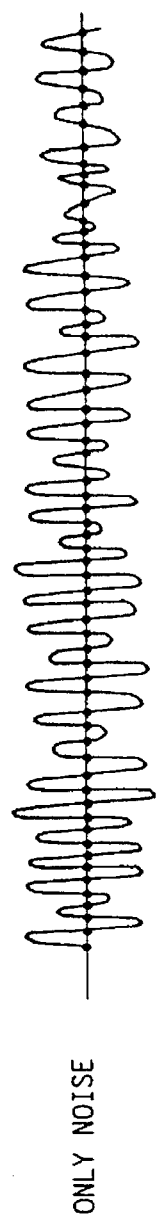
FIG. 9A
ONLY NOISE
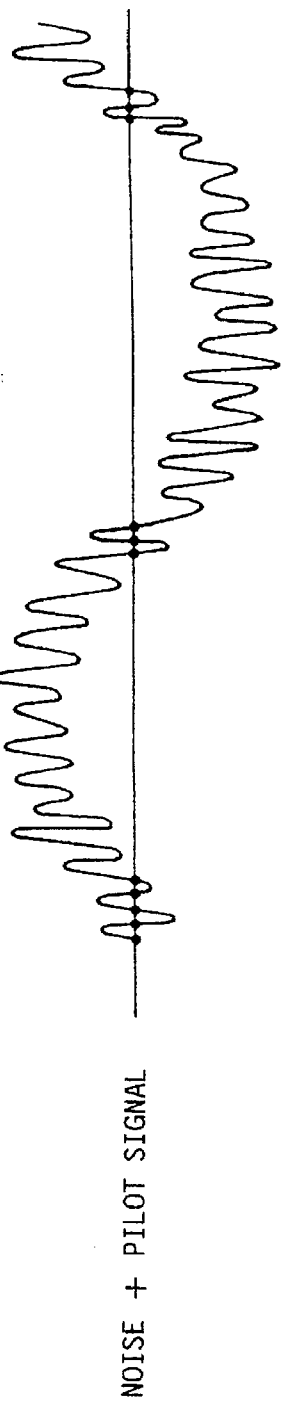
FIG. 9B
NOISE + PILOT SIGNAL

RADIO EQUIPMENT BASED ON AFC SYSTEM WITH TEMPERATURE DETECTION AND METHOD OF AUTOMATIC FREQUENCY CONTROL

FIELD OF THE INVENTION

This invention relates to radio equipment such as a radio transmitter or a mobile telephone, and especially to radio equipment based on an AFC system and method of automatic frequency control in a narrow-band communication system such as Tone in Band.

BACKGROUND OF THE INVENTION

In radio equipment for a narrow-band communication system such as Tone in Band, it is important that a frequency for transmission and receiving is accurate, and sometimes a stability of frequency exceeding that stipulated in the Electric Wave Law is required. For instance, in the 220 MHz zone in the United States, in the Electric Wave law (by the F.C.C) a stability of ±1.5 ppm (Approx. ±350 Hz) is required, but actually it is impossible to execute communication under good conditions unless the stability is in a range from ±50 Hz to ±100 Hz, so that a more strict stability of frequency than that stipulated in the Electric Wave Law is required.

FIG. 10 is an explanatory view for illustrating a range of frequency stability required in the Tone in Band system (from ±50 Hz to ±100 Hz). In the Tone in Band system, to respond to frequency shift due to Rayleigh fading and high speed fluctuation of amplitude, signal processing to remove the influence of these factors is executed referring to TONE (described pilot signal hereinafter) inserted at the center of a band as a reference signal. Namely a pilot signal having a constant value inserted at the center of a band is regarded as being under the influence of Rayleigh fading similar to a case of voice, so a processing for restoring the voice signal to its original form depending on the tone is executed.

However, in case of narrow-band communication, a pilot signal inserted in the band (narrow band) is separated from voice by only several hundreds Hz. For this reason, a band for a pilot filter to separate voice from the pilot signal is in a range of only around ±100 Hz. For this reason, if the frequency deviation becomes 100 Hz or more, it becomes impossible to receive a pilot signal correctly, or an aural element is mixed in a pilot signal, which deteriorates quality of communication or generates troubles such as impossibility of communication.

For the reasons as described above, in the Tone in Band system, frequency stability in a range of from ±50 Hz to ±100 Hz is required.

It is possible to realize the frequency stability as described above by employing a quartz oscillator based on an OVEN system or a reference oscillator employing the advanced digital technology therein (described "digital TCXO" hereinafter).

Also, a requirement concerning the frequency stability of electric waves transmitted from a base station is generally more strict for a mobile station, and in the 220 MHz in the United States described above, the allowable frequency deviation is ±0.1 ppm. For this reason, a frequency obtained by multiplying the frequency of electric waves transmitted from a base station as a base station by AFC is often used.

On the other hand, as a reference signal for demodulating received signals or for reducing fading, a pilot signal is often used. In a receiving section in a conventional type of radio equipment, the level of a pilot signal is measured, whether any received signal exists or not is determined, and squelch open/close is executed, thus only required voice signals being outputted and output of unnecessary noise being suppressed.

With the conventional type of radio equipment using a quartz oscillator based on an OVEN system as described above, however, a long time is required until the quarts oscillator is stabilized upon power turn ON, and some time is required for standing by after power is turned ON until the radio equipment becomes available.

With the conventional type of radio equipment using digital TCXO, as the digital TCXO is expensive, the apparatus cost becomes disadvantageously high.

Also in the conventional type of radio equipment, there are various types of causes for frequency deviation such as deviation due to an initial adjustment error, deviation due to temperature characteristics, deviation due to time elapse-related change, deviation due to time elapse-related change in parts of the oscillator, and deviation due to temperature characteristics of DC stabilized power supply due to the oscillator and AFC circuit. Even if a quartz oscillator based on the OVEN system or the digital TCXO is used, a satisfactory frequency stability and frequency precision can not always be achieved.

Especially, the frequency deviation due to deviation because of temperature characteristics is very large, and even if the digital TCXO generally regarded as the device having the highest frequency stability as well as the highest frequency precision is used, it has been fairly difficult to achieve a frequency precision in a range from −30° C. to +75° C.

On the other hand, with the conventional type of radio equipment based on the AFC system, in a narrow-band communication such as Tone in Band, communication is disabled by a slight frequency deviation, so that is impossible to multiply AFC without taking necessary measures such as searching by the estimated maximum frequency deviation. Also, the operation of capturing electric waves from a base station correctly is furthermore difficult in a border zone of a service area where the electric waves are very weak. For this reason, only after power for a mobile station is turned ON and electric waves from a base station are searched and received, it becomes possible to multiply AFC. In other words, some time for waiting is required after a mobile station turns ON power until it becomes actually available, which is disadvantageous.

Also in the conventional type of radio equipment, a level of pilot signal is measured, whether any received signal exists or not is determined, and then squelch open/close operation is executed. For this reason, it is difficult to distinguish a low power pilot signal from noise, and also malfunction of squelch easily occurs at a place with a high noise floor or in a weak electric field. Furthermore dispersion in sensitivity due to differences among individual radio equipment sometimes occurs during the manufacturing step, so that it is required to set up a threshold value used for determination of squelch for each piece of radio equipment, which increases cost.

Similarly in the conventional type of radio equipment based on the AFC system, a level of a signal is measured for making a determination as to whether the signal is a pilot signal or not, but when receiving a signal in a weak electric field, it is difficult to correctly distinguish a low power pilot signal from noise. Hence, sometimes an error may occur in measurement of the frequency of a pilot signal, which may in turn cause malfunction in the AFC.

SUMMARY OF THE INVENTION

It is an object of the present invention to reduce waiting time after power is turned ON until start of use as well as to improve frequency stability and frequency precision without increasing equipment cost.

It is another object of the present invention to absorb a frequency deviation due to various causes and enable stable AFC within a short period of time.

It is further object of the present invention to enable correctly distinguishing a pilot signal from noise even in a weak electric field or at a place with a high noise floor.

It is furthermore object of the present invention to limit AFC to as few malfunctions as possible when receiving a signal in a weak electric field.

In radio equipment based on the AFC system according to the present invention, when an AFC controller starts AFC, the AFC controller inputs detected temperature from a temperature detection sensor, reads a corresponding control frequency from a memory, and controls a reference frequency of a reference frequency oscillator according to the control frequency. Thus, waiting time from power turn ON until start of use is reduced, and frequency stability as well as the frequency precision is improved. Also when a lock signal is inputted from a frequency comparator, by storing a temperature value detected by the temperature detection sensor and a control frequency issued from the AFC controller to the reference frequency oscillator in a memory, data required for AFC is automatically learned through data accumulation and innovation in association with use of the radio equipment. Thus, frequency deviation due to various reasons is absorbed.

In radio equipment based on the AFC system according to the present invention, when the level of a pilot signal detected by the frequency comparator is lower than a specified value, the AFC controller does not store a temperature value detected by the temperature detection sensor, and the control frequency issued from the AFC controller to the reference frequency oscillator in a memory. Thus, only reliable data is stored in the memory.

In radio equipment based on the AFC system according to the present invention, when a lock signal is not inputted from the frequency comparator even if AFC is tried at control frequency specified times, search is started centering on the frequency. Thus, AFC and self-learning corresponding to time elapse-related and yearly changes are executed.

In radio equipment based on the AFC system according to the present invention, the AFC controller inputs detected temperature from the temperature detection sensor, reads out a corresponding control frequency from a memory, and starts AFC. But when the detection temperature value has not been stored in the memory, the AFC controller starts searching centering on a control frequency closest to the detected temperature value, and thus AFC is efficiently executed even to a temperature value not stored in the memory.

Also in radio equipment based on the AFC system according to the present invention, a signal passing through a pilot filter is inputted, a number of zero crossings within a specified period of time is counted, and squelch open/close control is executed depending on the count. Thus, the pilot signal being is distinguished from noise even when the level of the pilot signal is close to that of noise.

Also in radio equipment based on the AFC system according to the present invention, a signal passing through a pilot filter is inputted, the number of zero crossings within a specified period of time is counted, and determination as to whether the frequency of the pilot signal captured by the pilot filter is correct is made according to the count. If it is determined that the frequency is correct, the sub-audio data is decoded, and when correctly decoded, choice malfunction of AFC in a weak electric field is reduced by outputting a synchronizing signal to the AFC controller.

Other objects and features of this invention will become understood from the following description with reference to the accompanying drawings.

BRIEF DESCRIPTION OF THE DRAWINGS

FIG. 6 is an explanatory view for an example of a pilot filter;

FIGS. 9A and 9B are an explanatory view for a method of executing squelch open/close control according to times of zero crossings.

DESCRIPTION OF THE PREFERRED EMBODIMENTS

Detailed description is made hereinafter for radio equipment based on the AFC system in a first embodiment and second embodiment, respectively, with reference to the related drawings.

Figure 1:
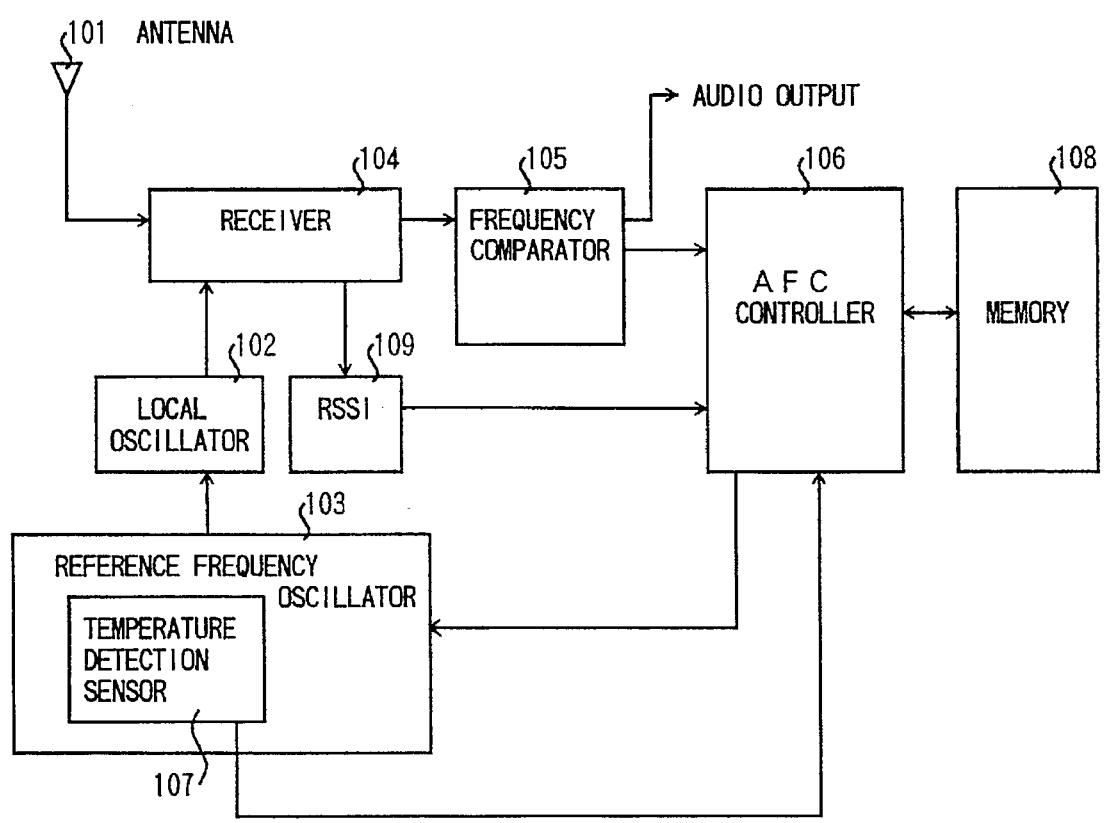
FIG. 1 is a general block diagram illustrating radio equipment based on the AFC system according to a first embodiment of the present invention.

FIG. 1 is a general block diagram illustrating the radio equipment based on the AFC system according to the first embodiment. The AFC system comprises an antenna 101 receiving electric waves transmitted from a base station (not shown herein), a local oscillator 102 which oscillates at a frequency used for generation of an IF signal, a reference frequency oscillator 103 for outputting a reference frequency used in control over the local frequency generated by the local oscillator 102, a receiver 104 based on a heterodyne system which inputs electric waves (described as "RF signal" hereinafter) received by the antenna 101, mixes the local frequency from the local oscillator 102 with the received input signal, and outputs an IF signal, a frequency comparator 105 which detects a pilot signal from an IF signal and outputs a lock signal or an unlock signal, an AFC controller 106 which locks or changes the reference frequency from the reference frequency oscillator 103 according to an output from the frequency comparator 105, a temperature detection sensor 107 which detects temperature in the reference frequency oscillator 103, a memory 108 for storing a control frequency from the AFC controller 106 and a temperature value detected by the temperature detection sensor 107, and an RSSI 109.

It should be noted that in first embodiment, TCXO satisfying provisions of the Electric Wave Law is used as the reference frequency oscillator 103. This figure shows only a receiving section which is a key section in this invention, but it should be noted that a typical transmitter is also incorporated.

Figure 2:
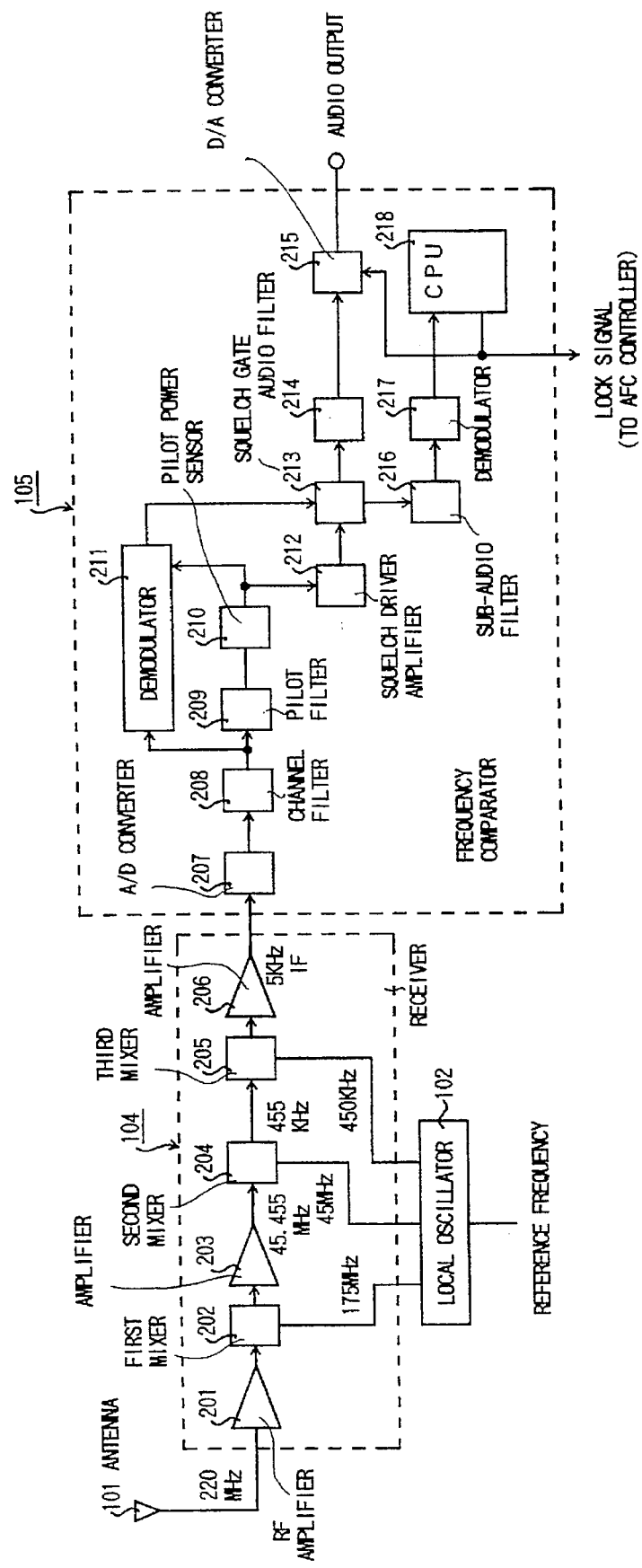
FIG. 2 is a block diagram illustrating a receiver as well as a frequency comparator in the first embodiment.

FIG. 2 shows a concrete configuration of the receiver 104 and the frequency comparator 105. Herein the receiver 104 is based on the triple super heterodyne system, and comprises an RF amplifier 201 which amplifies an RF signal (220 MHz) from the antenna 101, a first mixer 202 which inputs a local frequency of 175 MHz from the local oscillator 102 and mixes the input signal with an RF signal, an amplifier 203 which amplifies a first IF signal (45.455 MHz) outputted from the first mixer 202, a second mixer 204 which inputs a local frequency of 45 MHz from the local oscillator 102 and mixes the input signal amplified as described above in the first IF signal, a third mixer 205 which inputs a local frequency of 450 KHz from the local oscillator 102 and mixes the input signal with the second IF signal outputted from the second mixer 204, and an amplifier 206 which amplifies a third IF signal outputted from the third mixer 205. It should be noted that the frequency of the third IF signal outputted from the amplifier 206 is 5 KHz.

It should also be noted that the frequency comparator 105 comprises an A/D convertor 207 which inputs the third IF signal (analog signal) from the receiver 104 and executes analog/digital conversion, a channel filter 208 with a pass band of ±2 KHz, a pilot filter 209 which is a narrow-band filter with a pass band of around ±100 Hz for taking out a pilot signal, a pilot power sensor 210 for measuring the power level of the pilot signal, a demodulator 211 for demodulating signals, a squelch driver amplifier 212 which provides open/close control over a squelch gate 213 described hereinafter according to a power level of a pilot signal measured by the pilot power sensor 210, a squelch gate 213 which inhibits output of an voice signal when a power level of a pilot signal is very low, or when the electric field is very weak, an audio filter 214 which is a filter for taking out voice signal, a D/A convertor 215 which converts voice signal (herein a digital signal) to an analog signal, a sub-audio filter 216 which is a filter to take out sub-audio data, a demodulator 217 for demodulating sub-audio data, and a CPU 218 as an encoder and a decoder which inputs demodulated sub-audio data and makes a determination as to whether the sub-audio data has been received correctly or not. It should be noted that the cPU 218 outputs a lock signal to the AFC controller 106 when the sub-audio data has been received correctly.

With the configuration as described above, now description is made for ① basic operations of the AFC (automatic frequency control), ② features of the AFC operations according to the present invention, ③ a concrete example of a detected temperature value stored in a memory and a number of steps in AFC, and ④ lock signal output operations of the frequency comparator, in this order.

① General operations in AFC (automatic frequency control):

At first, description is made for general operations in AFC. When the frequency comparator 105 can not receive a pilot signal from a base station, the frequency comparator 105 outputs an unlock signal to the AFC controller 106. When the unlock signal is received, the AFC controller 106 starts searching. Herein, a "search" is defined as an operation for fine adjustment of the reference frequency oscillator 103 in relation to a number of steps, a variable range, and a variable speed. Fine adjustment of the reference frequency oscillator 103 is that of the local oscillator 102.

Also, values for a number of steps in a search, a variable range, and a variable speed can be specified previously according to the necessity, so that the values constitute conditions for receiving signals in good conditions. Especially in the present invention, a search is started by using the steps (corresponding to the frequency control) stored through self learning in the memory 108.

Then, when a pilot signal from a base station is captured by the frequency comparator 105 and it is determined that the frequency deviation is within an allowable range, determination as to whether sub-audio data has been received correctly or not is made, and if the sub-audio data has been received correctly, the frequency comparator 105 outputs a lock signal to the AFC controller 106. If the sub-audio data has not been received correctly, it indicates that the captured pilot signal is an error signal, so that search is retried for capturing a correct pilot signal.

When the AFC controller 106 receives a lock signal, searching is stopped immediately. This operation enables searching a frequency under good conditions.

Then, while used, if the frequency drifts due to change of temperature or for other reasons and the frequency deviation goes out of an allowable range, the frequency comparator 105 outputs an unlock signal to the AFC controller 106, and the AFC controller 106 again starts searching. Then, if it is determined by the frequency comparator 105 that the frequency deviation is within an allowable range and sub-audio data is received correctly, a lock signal is sent, and the AFC controller 106 stop searching.

On the other hand, when electric waves are transmitted from radio equipment, the signal is sent under the same conditions as those for locking in receiving as described above (namely, the frequency conditions for ending a locking signal). For this reason, when receiving, the AFC has not been synchronized, the reference frequency oscillator 103 outputs the reference frequency without being controlled, and transmission is executed according to this reference frequency, so that the possibility of unsuccessful transmission becomes higher.

② Features of AFC operations according to the present invention:

Next, description is made for features of AFC operations according to the present invention. At first, it is assumed, when the radio equipment in first embodiment 1 is used for the first time, that no data has been stored in the memory 108, or that a representative value corresponding to the tendency in temperature characteristics of the reference frequency oscillator 103 comprising TCXO has been stored as a default value.

For this reason, when used for the first time, the reference frequency oscillator 103 starts operation at the center of a variable range of frequency or with a default value.

In this step, if a pilot signal from a base station is received correctly and a lock signal is sent from the frequency comparator 105 to the AFC controller 106, the AFC controller 106 locks a control frequency to the reference frequency oscillator 103 at the position, the temperature value from the temperature detection sensor 107 located inside the reference frequency oscillator 103 is inputted, and the locked frequency (a frequency expressed as a number of steps described later) and the detected temperature are stored in the memory 108.

If the pilot signal from a base station is not received correctly, the frequency comparator 105 sends an unlock signal to the AFC controller 106. When the unlock signal is inputted, the AFC controller 106 immediately starts searching.

When it is determined, through searching by the AFC controller, that the frequency coincides with the reference frequency, a pilot signal from a base station is received correctly, and the frequency comparator 105 sends a lock signal to the AFC controller 106. When the lock signal is inputted, the AFC controller 106 immediately stops searching (enters a locked state), and then receiving is continued with a locked frequency under stable conditions.

At the same time, the AFC controller 106 stores a temperature value detected by the temperature detection sensor 107 (temperature in the reference frequency oscillator 103) and a number of steps in AFC (corresponding to the control frequency) in the memory 108.

Because of the operations described above, in association with daily use of the radio equipment, detected temperature values and corresponding numbers of steps in AFC are accumulated in the memory 108. It should be noted that, in a case where the same temperature value and the corresponding number of steps have been stored, the data is updated with a new detected temperature and the corresponding number of steps in AFC. Self learning is executed though storage or accumulation of new data as described above.

Then, if any data (detected temperature and a number of steps in AFC) has been stored in the memory 108, the radio equipment can immediately be actuated upon power turn ON by inputting the detected temperature at that time from the temperature detection sensor 107 and starting AFC according to the corresponding number of steps in AFC. This is accomplished by means of referring to a number of steps in AFC stored in the memory 108 as a key for searching the detected temperature, so that a time for waiting for locking (the waiting time for synchronization) is not required.

As described above, in the first embodiment, a temperature and conditions for AFC (a number of steps) under which communication can be executed smoothly are automatically learned and stored in a memory, so that, by setting a variable width of AFC to a slightly wider range, it is possible to maintain excellent communication by absorbing an adjustment error in TCXO which is the reference frequency oscillator 103 or time elapse related or yearly changes.

It should be noted that, in the first embodiment, actually the frequency comparator 105 and the RSSI 109 can be realized with a DSP (digital signal processor), and that, with this configuration, the DSP can always recognize a signal level when receiving signals, which eliminates the necessity of RSSI.

For this reason, the frequency comparator 105 measures a frequency of a pilot signal with a DSP. Also to furthermore improve reliability, sub-audio data, which is low speed data (300 BPS), are always transmitted together with voice, and if the sub-audio data can be decoded, it is regarded that locking is complete.

Also as described above, communication is started depending on data stored in the memory 108, but if communication is not successfully established even after several retries, searching is started centering on a number of steps in AFC then. With this operation, AFC corresponding even to time-elapse or yearly changes and self learning can be executed efficiently.

Furthermore in the first embodiment, the AFC controller 106 inputs a value of detected temperature from the temperature detection sensor 107, reads out the corresponding number of steps from the memory 108, and starts AFC. But if the detected temperature has not been stored in the memory 108, searching is started centering on a number of steps for the closest temperature. For this reason, AFC can be executed efficiently even under a temperature not stored in the memory 108.

③ Detected temperature stored in a memory and a concrete example of a number of steps in AFC:

Next, description is made for detected temperature stored in the memory 108 and a concrete number of steps in AFC.

Now it is assumed that the various conditions in use of a piece of radio equipment are as follows:

Frequency: 220 MHz

Frequency deviation (in transmission, legally rated): ±1.5 ppm

Maximum frequency deviation allowing normal operation of the receiver 104: ±50 Hz Local temperature range: −30° C. to +60° C., and furthermore it is assumed that a temperature range of the reference frequency oscillator 103 including self-temperature increase is from −30° C. to +75° C. and a TCXO with a frequency deviation of ±1.5 ppm is used.

In this case, ±1.5 ppm for 220 MHz is around +330 Hz, and the maximum frequency deviation allowing normal operation of the receiver 104 is ±50 Hz, so that the number of required steps in AFC is:

$$N=(330\times2)/50=13.2\approx14,$$

and it is decided by adding a middle point of the step to this value that the required number of steps is 15 (14+1). This number of steps indicates that at least 15 steps are required, and it is needless to say that precision of AFC can be improved by increasing the number of steps to, for instance, 32 steps or 64 steps.

Figure 3:
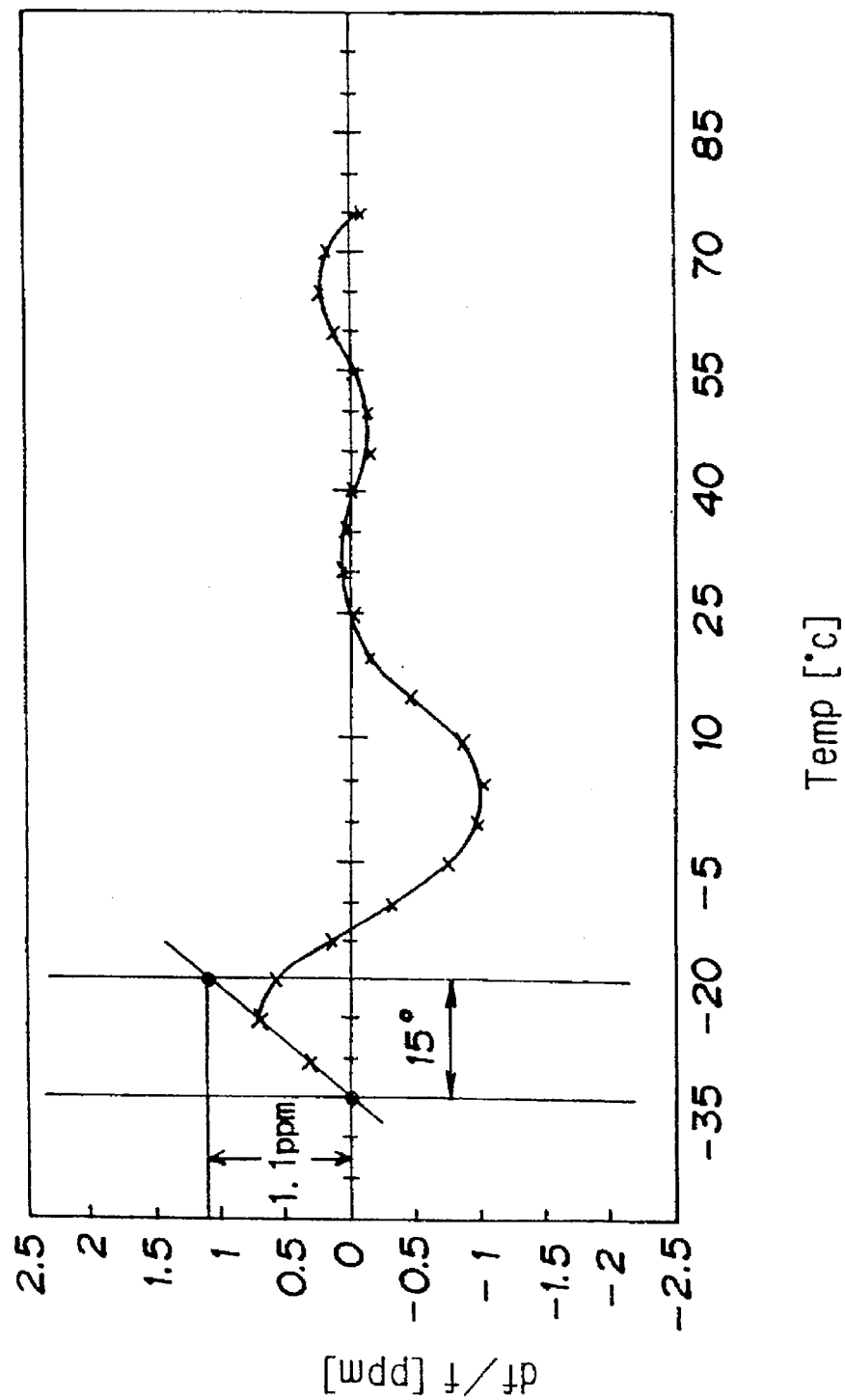
FIG. 3 is an explanatory view for illustrating characteristics of TCXO.

Also, temperature data for the reference frequency oscillator 103 may be decided from characteristics of the TCXO to be used and a required frequency precision. FIG. 3 shows an example of characteristics of a TCXO, and in this case frequency deviation per degree of 1.1 ppm/15° C.≈0.07333 ppm/°C. in a section from −30° C. to −25° C. where the inclination degree is the largest in a range from −30° C. to +75° C.

A required frequency precision of ±50 Hz for normal operation of the radio equipment with this TCXO incorporated therein, when expressed in temperature, can be calculated as follows:

$$\pm50 \text{ Hz}/220 \text{ MHz}\approx\pm0.227 \text{ ppm, and}$$

$$0.227 \text{ ppm}/0.07333 \text{ ppm/°C.}\approx3.1° \text{ C.}$$

This indicates that temperature data sampled with an interval smaller than 3.1° C. is allowable. Even if a slight margin is considered for precision, data sampled with an interval of 3° C. is allowable, and this interval of 3° C. is used as a pitch for temperature measurement. Also the pitch for temperature measurement may not always, even in its interval, be in a temperature range from −30° C. to +75° C., and it is possible to employ a pitch of 1.5° C., for instance, in a range from −30° C. to −25° C. where change for temperature is very large, and a pitch of 4° C. in a range from +25° C. to +55° C. where change for temperature is 4° C.

When a larger number of steps in AFC and a smaller pitch for temperature measurement are used, the precision of AFC becomes higher, but then a larger storage capacity is required for the memory 108 in proportion to a number of pitches for temperature measurement, so that an appropriate number of steps for AFC as well as an appropriate pitch should be decided by taking into considerations the factors as described above.

Figure 4:
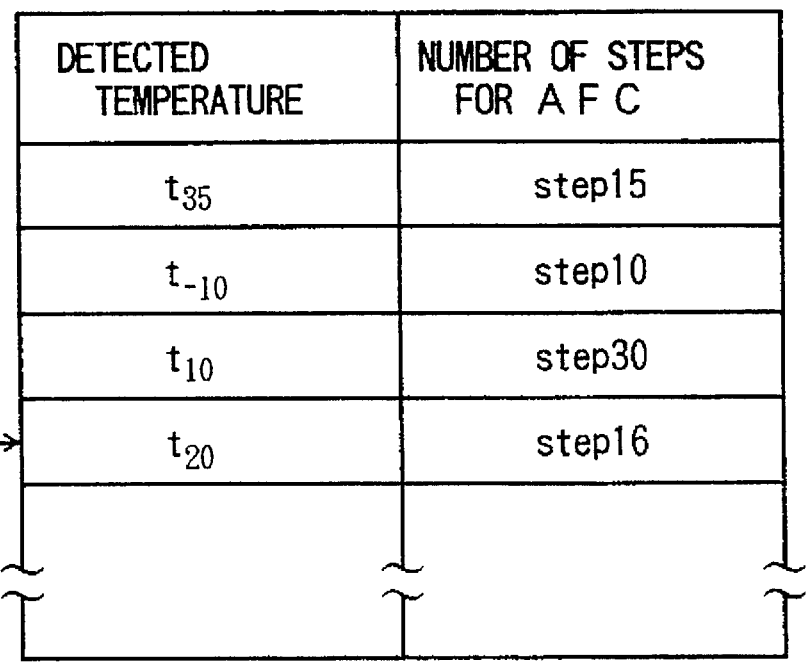
FIG. 4 is an explanatory view showing detected temperature stored in a memory and a number of steps in AFC.

FIG. 4 shows an example of detected temperature stored in the memory 108 as well as of a number of steps for AFC, and in a case where the detected temperature when a pilot signal is correctly received is $t_{20}$, if the corresponding number of steps for AFC is 16 steps, the number is stored in the memory 108 as indicated by the arrow 401 in the figure. For this reason, when power for the radio equipment is turned ON, the AFC controller 106 reads a number of steps for AFC corresponding to the detected temperature stored in the memory 108 using the temperature value detected by the temperature detection sensor 107 upon power turn ON as a key for searching. Thus AFC is started.

In the first embodiment, a TCXO compensated in relation to temperature is used as the reference frequency oscillator 103. But if an oscillator not subjected to temperature compensation is used as the reference frequency oscillator 103, the TCXO works as if it were a TCXO subjected to temperature compensation by using electric waves from the base station as a reference frequency. In other words, it is possible to improve the frequency stability and the frequency precision without using an expensive TCXO.

(4) Operation of a frequency comparator for outputting lock signal:

Next, description is made for an operation of the frequency comparator 105 for outputting a lock signal. In the first embodiment, a pilot signal inserted at the center of the communication band is detected in the frequency comparator 105. Determination as to whether sub-audio data has been received or not is made by decoding the sub-audio data. If the sub-audio data has been received, it is determined that the pilot signal was received correctly, and a lock signal is outputted.

Figure 5:
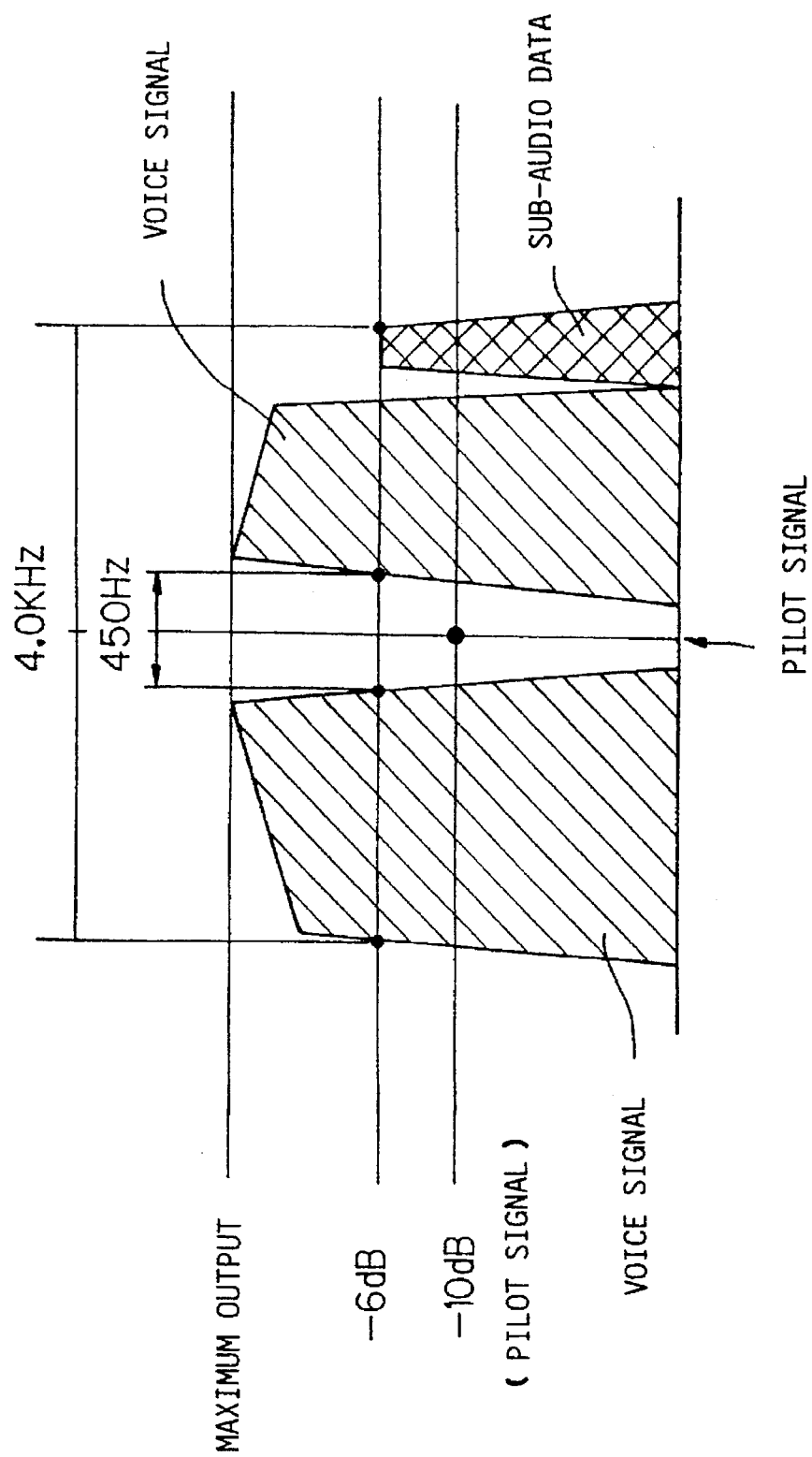
FIG. 5 is an explanatory view for an example of a pilot signal and sub-audio data arrangement in a spectrum for Tone in Band.

FIG. 5 shows an example of pilot signal and sub-audio data allocation in a spectrum of Tone in Band, and as shown in this figure, a pilot signal is transmitted being incorporated at around a middle point of the distance between the voice signals. Also to control the system, sub-audio data is always transmitted.

FIG. 6 shows the pilot filter 209, and as shown in this figure, this filter captures a pilot signal in a band width of around 350 Hz.

As shown in FIG. 2, the frequency comparator 105 converts an IF signal (analog signal) inputted from the receiver 104 to a digital signal with an A/D converter, and sends the signal via the channel filter 208 to the pilot filter 209. The pilot filter 209 captures the pilot signal (more precisely, a candidate for a pilot signal), and measures the power level of the pilot signal with the pilot power sensor 210.

When a power level of a pilot signal is inputted from the pilot power sensor 210 into the squelch driver amplifier 212, the squelch driver amplifier 212 amplifies the signal and sends it to the squelch gate 213. The squelch gate 213 closes or opens squelch according to the squelch driver amplifier 212. Then the squelch driver amplifier 212 does not generate a signal output by reducing the amplification gain if the input signal does not satisfy the prespecified requirements. In other words, the squelch driver amplifier 212 can keep the squelch gate 213 in the closed state if the power level of the pilot signal is below a specified level.

For this reason, if the power level of the pilot signal is equal to or higher than the specified level, the squelch gate 213 opens, the sub-audio data shown in FIG. 5 is demodulated via the sub-audio filter 216 and the demodulator 217, then the demodulated sub-audio data is decoded in the CPU 218, and determination as to whether the sub-audio data has been received correctly or not is executed. If the sub-audio data has been received correctly, the CPU 218 outputs a lock signal to the AFC controller 106.

Figure 7:
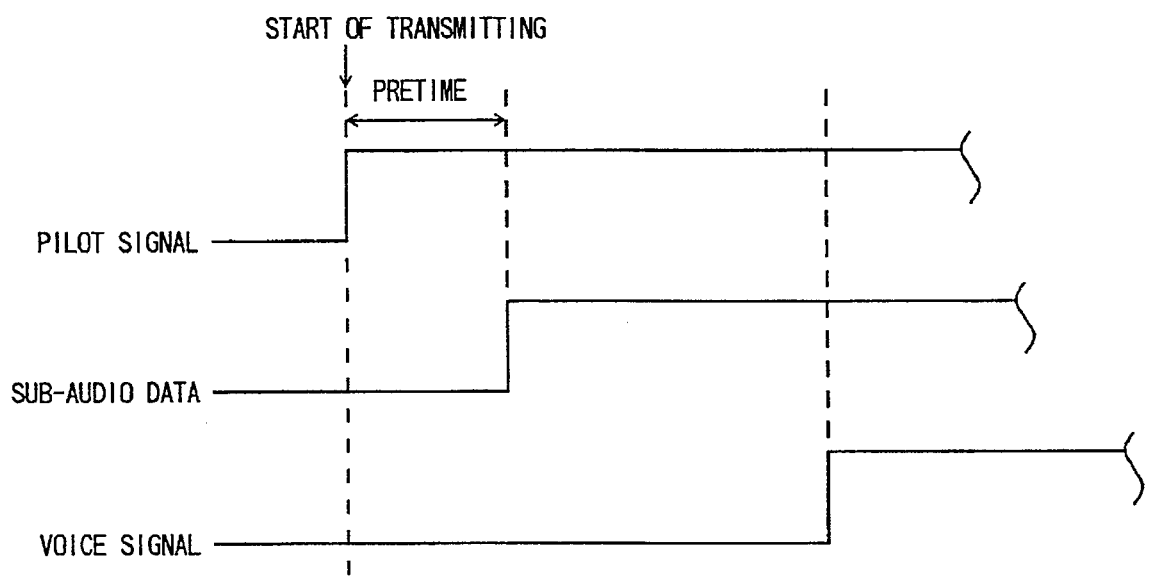
FIG. 7 is an explanatory view for an example in which a time for AFC operation is provided as pretime in a transmitting side (for instance, in a base station)

It should be noted that, in the first embodiment, a time for AFC operations is provided as a pretime in the transmitter side (for instance, in the base station), as shown in FIG. 7.

As described above, in the first embodiment, determination as to whether a pilot signal has been received correctly is made by making a determination as to whether the sub-audio data has been correctly received by decoding the sub-audio data. If the sub-audio data has been received correctly, it is determined that the pilot signal has been received correctly, and a lock signal is outputted to the AFC controller 106, so that occurrences of malfunctions in AFC can be reduced.

Radio equipment based on the AFC system in the second embodiment has a zero crossing counter into which a signal having passed through a pilot filter is inputted and which counts zero crossings within a certain period of time, and controls open/close of squelch based on the count provided by the zero crossing counter. Also, the radio equipment makes a determination as to whether the frequency of a pilot signal captured by a pilot filter is correct based on a count provided from the zero crossing counter. If it is determined that the frequency is correct, the radio equipment decodes sub-audio data, and if decoded correctly, outputs a lock signal to the AFC controller.

Figure 8:
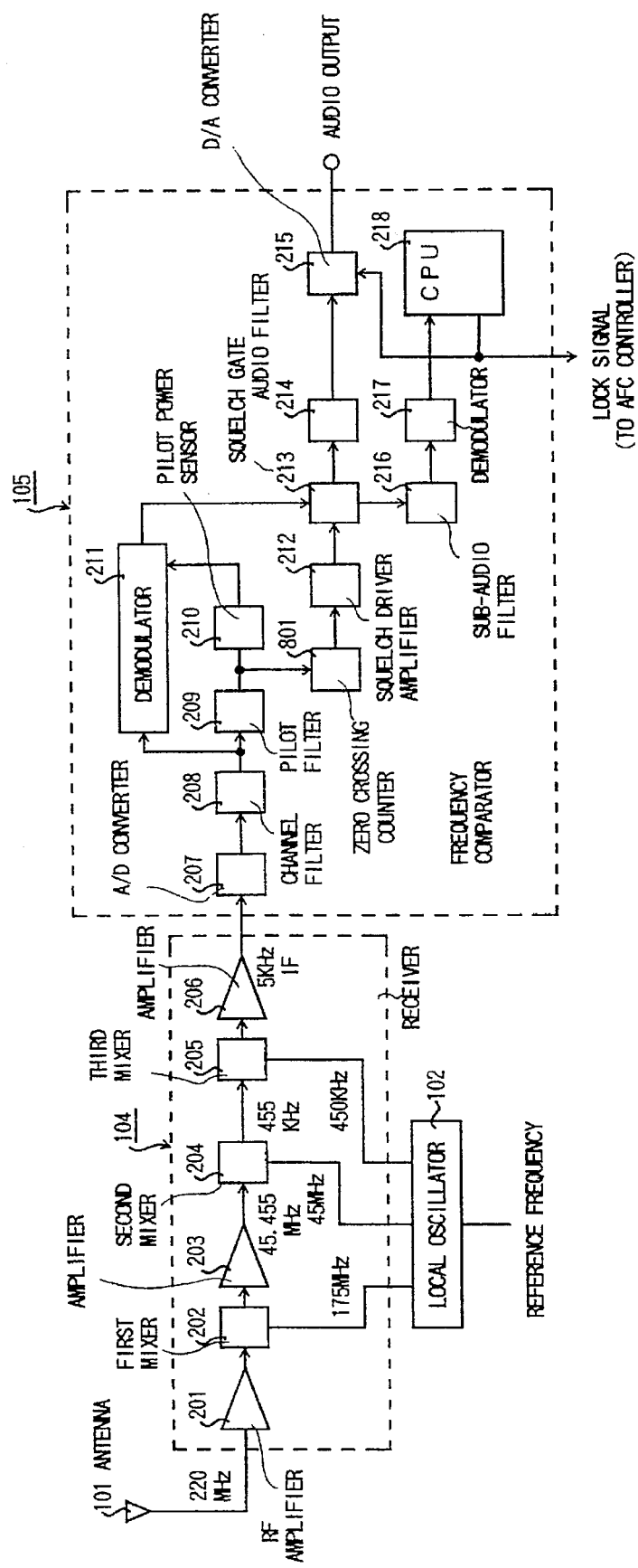
FIG. 8 is a block diagram for a receiver and a frequency comparator in second embodiment.
Figure 10:
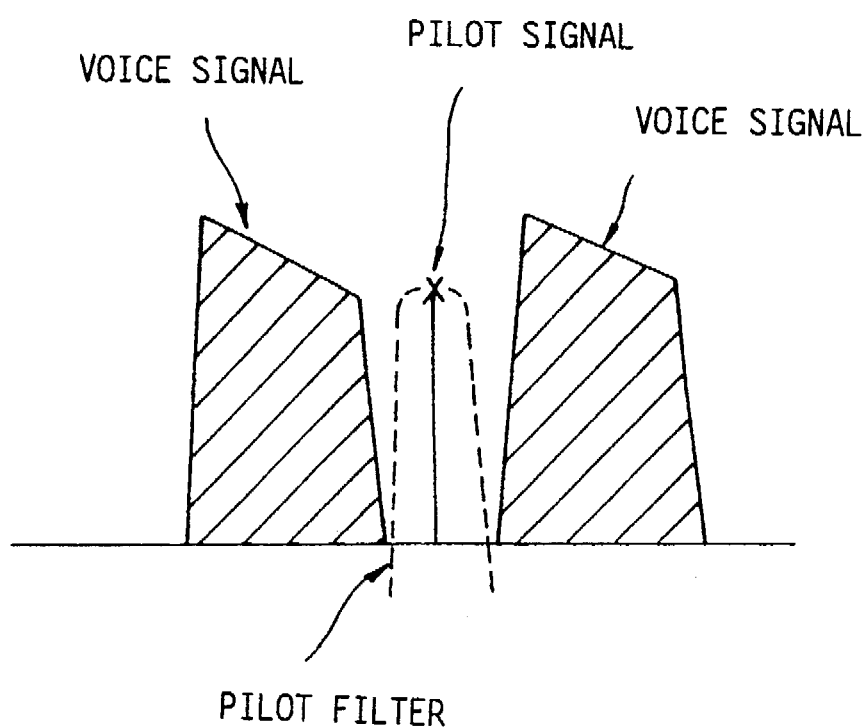
FIG. 10 is an explanatory view for a range of frequency stability required in the Tone in Band system (a range of from ±50 Hz to around ±100 Hz).

FIG. 8 shows a concrete block diagram of a receiver as well as of a frequency comparator in the second embodiment, and the block diagram is the same as that in first embodiment, excluding that a zero crossing counter 801 is added to the system configuration of second embodiment shown in FIG. 2. It should be noted that other portions of the configuration are the same as those in first embodiment and description thereof is omitted herein.

In FIG. 8, the zero crossing counter 801 inputs a signal from the pilot filter 209, counts number of zero crossings within a certain period of time (times when a signal level crosses a value of zero), and sends the count to the squelch driver amplifier 212. When the count of zero crossings from the zero crossing counter 801 is inputted into the squelch driver amplifier 212, the squelch driver amplifier 212 amplifies the signal and sends it to the squelch gate 213. The squelch gate 213 closes or opens the squelch according to a signal from the squelch driver amplifier 212. Then, if the input signal does not have the specified characteristics, the squelch driver amplifier reduces gain for amplification to suppress output of a signal. In other words, the squelch driver amplifier works according to a zero crossing count, and can keep the squelch gate 213 closed when the zero crossing count is not less than a specified value.

With the configuration as described above, now description is made of the operation. Squelch control is generally executed according to a power level of a pilot signal sent at a certain level irrespective of whether modulation is executed. However, a squelch generally identifies a very weak signal and is a receiver based on an amplitude modulating system. Hence, the threshold level changes according to a noise level specified to each individual receiver or a level of foreign noise such as urban noise or snow. Especially in the case of a receiver with a fixed squelch level, it is very difficult to distinguish a pilot signal with a lower power level from noise. Also, sometimes an error may occur in measurement of a frequency of a pilot signal, which in turn may cause a malfunction in AFC.

For this reason, to solve the problems as described above, as shown in FIG. 8, the zero crossing counter 801 is provided at the back of the pilot filter 209, and open/close of the squelch is controlled according to a count of zero crossings. Namely, utilization of a pilot signal is like that in the conventional system, but the power level of the pilot signal is not used. The number of zero crossings within a certain period of time due to a pilot signal is counted, and whether a pilot signal exists or not is determined according to the count to provide controls over open/close operation of the squelch.

Next, description is made for a method of controlling open/close operations of a squelch according to the number of zero crossings with reference to FIG. 9. If there is no pilot signal among signals having passed through the pilot filter 209 and there is only noise, the number of times a signal level crosses a value of zero becomes larger shown in FIG. 9A. On the other hand, if there are a pilot signal and noise among signals having passed through the pilot filter 209, a signal form of a pilot signal is overlapped with the noise, so that the times when a signal level crosses a value of zero becomes smaller, as shown in FIG. 9B. For this reason, by counting the times as times of zero crossing with the zero crossing counter 801, it is possible to make a determination as to whether an input signal is noise or a regular signal including a pilot signal.

In the second embodiment, as described above, squelch open/close control is executed according to the number of zero crossings, so that a pilot signal can be distinguished from noise even in a weak electric field and a place with a high noise floor, and also the number of malfunctions of a squelch can be reduced. Also, the squelch can work without being influenced by changes in foreign noise or a noise level specific to each receiver.

In the second embodiment, as clearly shown in FIG. 2, whether a pilot signal has been received correctly is executed not by checking the power level of the pilot signal, but by checking for existence of a pilot signal according to number of zero crossings, opening the squelch, then decoding sub-audio data, making a determination as to whether the sub-audio data has been received correctly, determining that the pilot signal has been received correctly if the sub-audio data has been received correctly, and outputting a lock signal to the AFC controller 106, so that malfunctions in AFC can be reduced. AFC with few malfunctions can be executed even in a weak electric field.

It should be noted that, although determination as to whether a pilot signal has been received correctly is made by checking whether sub-audio data has been received correctly, malfunctions in AFC can be reduced in receiving signals in a weak electric field even when the present invention is applied to radio equipment system not employing sub-audio data therein.

As described above, radio equipment based on the AFC system according to the present invention comprises a local oscillator oscillating a local frequency to be used for generation of an IF signal, a reference frequency oscillator which outputs a reference frequency to control a local frequency generated by the aforesaid local oscillator, a receiver based on the heterodyne system into which a received input signal is inputted and which mixes a frequency from the local oscillator with the received input signal and outputs an IF signal, a frequency comparator which detects a pilot signal from the IF signal and outputs a lock signal or an unlock signal according to whether a pilot signal exists, and an AFC controller which locks or changes the reference frequency generated by the reference frequency oscillator according to output from the frequency comparator. The equipment has a temperature detection sensor which detects the temperature of the reference frequency oscillator and a memory to store a control frequency for the AFC controller and a temperature value detected by the temperature detection sensor therein. The AFC controller described above, when starting AFC, inputs detected temperature from the temperature detection sensor, reads the corresponding control frequency from the memory and controls the reference frequency generated by the reference frequency oscillator according to the control frequency. When a lock signal is inputted from the frequency controller, the AFC controller stores the temperature detected by the temperature detection sensor and the control frequency for the reference frequency oscillator in the memory. Hence, it is possible to reduce a time for waiting upon power turn ON until start of use and also to improve the frequency stability and frequency precision without increasing the system cost. Also it is possible to absorb a frequency division due to various types of causes as well as to execute stable AFC within a short period of time.

Also, in radio equipment based on the AFC system according to the present invention, the AFC controller makes it possible to store only reliable data in a memory, when the power level of the pilot signal detected by the frequency comparator is smaller than a specified value, so that a temperature value detected by the temperature detection sensor and the control frequency issued by the AFC controller to the reference frequency oscillator will not be stored in the memory. Hence, self learning for AFC can be executed efficiently.

The radio equipment based on the AFC system according to the present invention starts searching, even if the AFC controller tries AFC by specified times with the control frequency, when a lock signal is not inputted from the frequency comparator, centering on the control frequency, so that AFC can be executed efficiently.

In radio equipment based on the AFC system according to the present invention, the AFC controller inputs a detected temperature from the temperature detection sensor, reads the corresponding control frequency from the memory, and starts AFC. If the corresponding detected temperature has not been stored in the memory, however, the AFC controller starts searching centering on a control frequency for the closest temperature, so that AFC can efficiently be executed.

In radio equipment based on the AFC system according to the present invention, the frequency comparator comprises a pilot filter which is a coarse filter for a pilot signal, a zero crossing counter into which a signal having passed through the pilot filter is inputted and which counts number of zero crossings within a certain period of time, and a squelch circuit which controls open/close operations of a squelch according to the count provided from the zero crossing counter, so that a pilot signal can correctly be distinguished from noise even in a weak electric field or at a place with a high noise floor.

Also, in the radio equipment based on the AFC system according to the present invention, the frequency comparator comprises a pilot filter which is a coarse filter for a pilot signal, a zero crossing counter into which a signal having passed through the pilot filter is inputted and which counts number of zero crossings within a certain period of time, and a decision circuit which makes a determination as to whether the frequency of the pilot signal captured by the pilot filter is correct according to a count provided from the zero crossing counter. A synchronizing circuit which decodes sub-audio data, if it is determined by the decision circuit that the frequency of the pilot signal was correct and decoding is executed correctly, and outputs a lock signal to the AFC controller. Hence, AFC can be executed with few malfunctions even when receiving a signal with a low power level.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. Radio equipment based on AFC system comprising:
   a local oscillator which oscillates at a local frequency used for generation of an IF signal;
   a reference frequency oscillator which outputs a reference frequency to said local oscillator;
   a receiver which receives an input signal from an antenna and which mixes the frequency from said local oscillator with said received input signal and outputs said IF signal;
   a temperature detection sensor which detects a temperature value related to said reference frequency oscillator;
   a memory for storing entries comprising a value of said reference frequency and a corresponding temperature value detected by said temperature detection sensor therein;
   a frequency comparator adapted to detect a pilot signal from a base station in said IF signal and to output an unlock signal or a lock signal according to whether a pilot signal is detected;
   an AFC controller which locks the reference frequency when said pilot signal is detected or changes the reference frequency in accordance with said temperature value when said pilot signal is not detected.

2. Radio equipment based on AFC system according to claim 1, wherein said AFC controller performs inputting a detected temperature, when starting AFC, from said temperature detection sensor, reading a corresponding control frequency from said memory, providing controls over a reference frequency from said reference frequency oscillator according to said control frequency, or when a lock signal is inputted from said frequency comparator, storing a temperature value produced by said temperature detection sensor as well as said control frequency issued from said AFC controller in said memory.

3. Radio equipment based on AFC system according to claim 1, wherein said receiver is based on a heterodyne system.

4. Radio equipment based on AFC system according to claim 1, wherein said AFC controller does not store said temperature value and said control frequency of said AFC controller for said value of said reference frequency in said memory when the power level of a pilot signal detected by said frequency comparator is lower than a reference value.

5. Radio equipment based on AFC system according to claim 1, wherein said AFC controller searches for a pilot signal beginning with a reference frequency stored with said temperature value from said temperature selection then, when a lock signal is not inputted from said frequency comparator sensor.

6. Radio equipment based on AFC system according to claim 1, wherein said AFC controller inputs a detection temperature value from said temperature detection sensor, reads the corresponding reference frequency value from said memory, and starts AFC, but if the corresponding detected temperature has not been stored in said memory the AFC controller starts searching centering on a reference frequency stored in memory for the closest temperature.

7. Radio equipment based on AFC system according to claim 1, wherein said frequency comparator comprises a pilot filter which is a coarse filter for a pilot signal, a zero crossing counter into which a signal having passed through said pilot filter is input and which counts a number of zero crossings occurring within a certain period o time, and a squelch circuit which provides open/close control over a squelch according to a count provided from said zero crossing counter.

8. Radio equipment based on AFC system according to claim 1, wherein said frequency comparator comprises a pilot filter which is a coarse filter for a pilot signal, a zero crossing counter into which a signal having passed through said pilot filter is input and which counts a number of zero crossings within a certain period of time, a decision circuit which makes a determination as to whether the frequency of a pilot signal captured by said pilot filter is correct according to a count provided from said zero crossing counter, and a synchronizing circuit which decodes sub-audio data if it is determined by said decision circuit that the frequency of said pilot signal is correct, and outputs a lock signal to said AFC controller on the condition that decoding is executed correctly.

9. In radio equipment including a base station and a remote station having a local oscillator, an automatic frequency control system comprising:
   a reference frequency oscillator for generating a reference frequency signal to control said local oscillator;
   a temperature detector responsive to said reference frequency oscillator for generating a temperature signal indicative of a temperature of said reference frequency oscillator;
   a controller responsive to said temperature signal and a related corresponding reference frequency signal for controlling said frequency oscillator immediately after said radio equipment is provided with power; and
   a frequency comparator for supplying said controller with an unlock signal to adjust said reference frequency oscillator in accordance with said temperature signal when a pilot frequency control signal from said base station is not detected by said radio equipment, and for supplying said controller with a lock signal to lock said reference frequency oscillator when said pilot frequency control signal is detected.

10. The system of claim 9, further comprising a memory having one or more entries for supplying said controller with a reference frequency signal corresponding to said temperature signal.

11. The system of claim 10, wherein said memory is provided with said control frequency signal by said controller.

12. The system of claim 10, wherein said memory further stores a temperature signal supplied by said temperature detector.

13. The system of claim 12, wherein said memory is provided with said reference frequency signal and said temperature signal only when said pilot frequency control signal detected by said radio equipment exceeds a predetermined value.

14. The system of claim 10, wherein said controller is provided with the unlock signal to search said memory for the reference frequency signal corresponding to the temperature signal supplied by said temperature detector.

15. In a radio equipment including a base station and a remote station having a local oscillator controlled by a reference frequency supplied by a reference frequency oscillator, a method of automatic frequency control comprising the steps of:

detecting a temperature of said reference frequency oscillator with a temperature detector;

detecting a pilot frequency control signal provided by said base station;

if said pilot frequency control signal is detected, locking the reference frequency and supplying a control value applied to the reference frequency oscillator and a detected temperature to a memory; and if said pilot frequency control signal is not detected, controlling the reference frequency in accordance with the control value stored in the memory and corresponding to the temperature detected by said temperature detector.

16. The method of claim 15, wherein said control value and said temperature are supplied to said memory only when said pilot signal exceeds a predetermined level.

17. The method of claim 15, wherein said memory is searched for the control value corresponding to a temperature valued closest to the temperature detected by said temperature detector.

* * * * *